United States Patent
Takeuchi (10) Patent No.: US 6,295,118 B1
(45) Date of Patent: *Sep. 25, 2001

(54) OPTICAL ARRANGEMENT FOR EXPOSURE APPARATUS

(75) Inventor: Seiji Takeuchi, Tucson, AZ (US)

(73) Assignee: Canon Kabushiki Kaisha, Tokyo (JP)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 08/959,304

(22) Filed: Oct. 28, 1997

(30) Foreign Application Priority Data

Oct. 29, 1996 (JP) .................................................. 8-303901

(51) Int. Cl.⁷ .......................... G03B 27/68; G03B 27/42; G03B 27/52; G03B 3/12
(52) U.S. Cl. .............................. 355/52; 355/53; 355/55; 355/30; 359/565; 359/573; 250/201.1
(58) Field of Search .................... 355/30, 52, 53, 355/55; 359/565, 573, 666, 667, 824, 292; 250/201.1, 201.2, 201.3

(56) References Cited

U.S. PATENT DOCUMENTS

| | | | |
|---|---|---|---|
| 3,641,354 | * 2/1972 | DeMent | 359/292 |
| 3,861,784 | * 1/1975 | Torok | 359/573 |
| 4,331,388 | * 5/1982 | McCrobie et al. | 359/667 |
| 4,616,908 | * 10/1986 | King | 359/667 |
| 4,666,273 | 5/1987 | Shimizu et al. | 353/101 |
| 4,676,631 | 6/1987 | Kosugi et al. | 355/55 |
| 4,690,528 | * 9/1987 | Tanimoto et al. | 355/53 |
| 4,825,247 | * 4/1989 | Kemi et al. | 355/55 |
| 4,871,237 | * 10/1989 | Anzai et al. | 355/53 |
| 4,895,790 | 1/1990 | Swanson et al. | 430/321 |
| 4,920,505 | * 4/1990 | Suzuki | 355/55 |
| 4,936,665 | 6/1990 | Whitney | 350/451 |
| 5,020,879 | * 6/1991 | Kuzuta et al. | 359/573 |
| 5,025,284 | * 6/1991 | Komoriya et al. | 355/53 |
| 5,337,097 | * 8/1994 | Suzuki et al. | 355/53 |
| 5,794,023 | * 8/1998 | Hobbs et al. | 359/565 |

FOREIGN PATENT DOCUMENTS 5-9934   2/1993  (JP) .
6-230298  8/1994  (JP) .

OTHER PUBLICATIONS

G.J. Swanson, "Binary Optics Technology: The Theory and Design of Multi–Level Diffractive Optical Elements", Massachusetts Institute of Technology Lincoln Laboratory, Technical Report 854, Aug. 14, 1989.

G.J. Swanson, "Binary Optics Technology: Theoretical Limits on the Deffraction Efficiency of Multilevel Diffractive Optical Elements", Massachusetts Institute of Technology Lincoln Laboratory, Technical Report 914, Mar. 1, 1991.

* cited by examiner

Primary Examiner—Alan A. Mathews
(74) Attorney, Agent, or Firm—Fitzpatrick, Cella, Harper & Scinto (57) ABSTRACT

An optical arrangement includes a diffractive optical element and a curvature control system for changing curvature of the diffractive optical element. The optical arrangement can be incorporated into an exposure apparatus having an illuminating system for illuminating a mask having a pattern formed thereon and a projecting system for projecting the pattern of the mask onto a wafer, such that the projecting system includes a diffractive optical element and a curvature control system for changing curvature of the diffractive optical element.

27 Claims, 10 Drawing Sheets

OPTICAL ARRANGEMENT FOR EXPOSURE APPARATUS

FIELD OF THE INVENTION AND RELATED ART

This invention relates to an optical arrangement and an exposure apparatus and, in another aspect, the invention is concerned with a device manufacturing method which uses such an exposure apparatus.

Semiconductor device manufacturing technology has recently advanced considerably, and fine processing techniques have also developed largely. In recent years, a major stream is to use a reduction projection exposure apparatus (stepper) having a resolution of sub-micron order to perform the fine processing. For further enhancement of resolution, many attempts such as enlargement of numerical aperture (NA) of an optical system, shortening of exposure wavelength and introduction of new optical elements, such as a diffractive optical element, for example, have been made.

Figure 1:
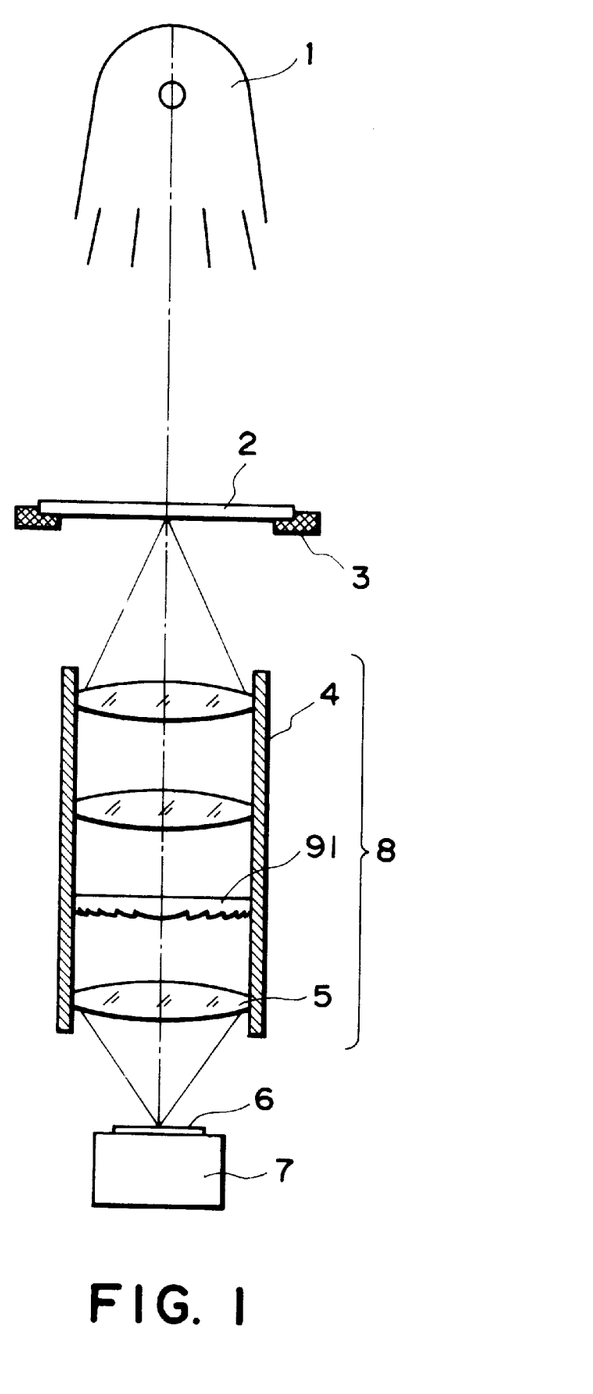
FIG. 1 is a schematic view of a main portion of an exposure apparatus of a known type.

FIG. 1 is a schematic view of a main portion of an exposure apparatus of a known type. Denoted in the drawing at 1 is a light source, and denoted at 2 is a reticle (mask) having a pattern formed thereon. Denoted at 3 is a reticle stage, and denoted at 4 is a barrel. Denoted at 91 is a diffractive optical element, and denoted at 5 is a lens. The barrel 4, diffractive optical element 91 and lens 5 are components of a projection lens (optical system) 8. Denoted at 6 is a wafer, and denoted at 7 is a wafer stage.

In operation for printing a circuit pattern on a wafer by using such an exposure apparatus, the wafer is first positioned at a desired position by means of the wafer stage 7. Then, through focus detecting means (not shown), the position of the wafer 6 is adjusted with respect to a focus position. Subsequently, a shutter (not shown) is opened, and the reticle is illuminated with illumination light from the light source 1. By this, the circuit pattern of the reticle is projected onto the wafer 6 through the projection lens B. The lens 5 is movable upwardly and downwardly, for correction of magnification or aberration of the projection optical system, to meet expansion of the wafer due to thermal distortion, for example.

A diffractive optical element which can be used in the exposure apparatus of FIG. 1 may have a diameter of about 200 mm. If the diffractive optical element 91 is held on the barrel 4 in a conventional way, the diffractive optical element will distort due to gravity. It causes aberration and, thus, a change in optical characteristic of the projection lens.

Further, moving the lens upwardly and downwardly for correction of an optical characteristic of the projection lens, such as magnification or aberration, requires a complicated mechanism. The machining or assembling is not easy and, additionally, the control is not easy.

SUMMARY OF THE INVENTION

It is an object of the present invention to provide an optical arrangement in which distortion of a diffractive optical element due to gravity or optical characteristic of a projection lens of an exposure apparatus can be corrected easily with a simple structure.

It is another object of the present invention to provide an exposure apparatus with an optical arrangement in which distortion of a diffractive optical element due to gravity or optical characteristic of a projection lens of an exposure apparatus can be corrected easily with a simple structure.

It is a further object of the present invention to provide a device manufacturing method which uses such an exposure apparatus.

In accordance with an aspect of the present invention, there is provided an optical arrangement, comprising: a diffractive optical element; and curvature control means for changing curvature of said diffractive optical element.

In accordance with another aspect of the present invention, there is provided an exposure apparatus, comprising: illuminating means for illuminating a mask having a pattern formed thereon; and projecting means for projecting the pattern of the mask onto a wafer, said projecting means including a diffractive optical element, and curvature control means for changing curvature of said diffractive optical element.

In accordance with a further aspect of the present invention, there is provided a device manufacturing method, comprising the steps of: printing an image of a pattern of a mask onto a wafer by use of an exposure apparatus as recited above, and developing the wafer.

These and other objects, features and advantages of the present invention will become more apparent upon a consideration of the following description of the preferred embodiments of the present invention taken in conjunction with the accompanying drawings.

DESCRIPTION OF THE PREFERRED EMBODIMENTS

Embodiment 1

Figure 2A:
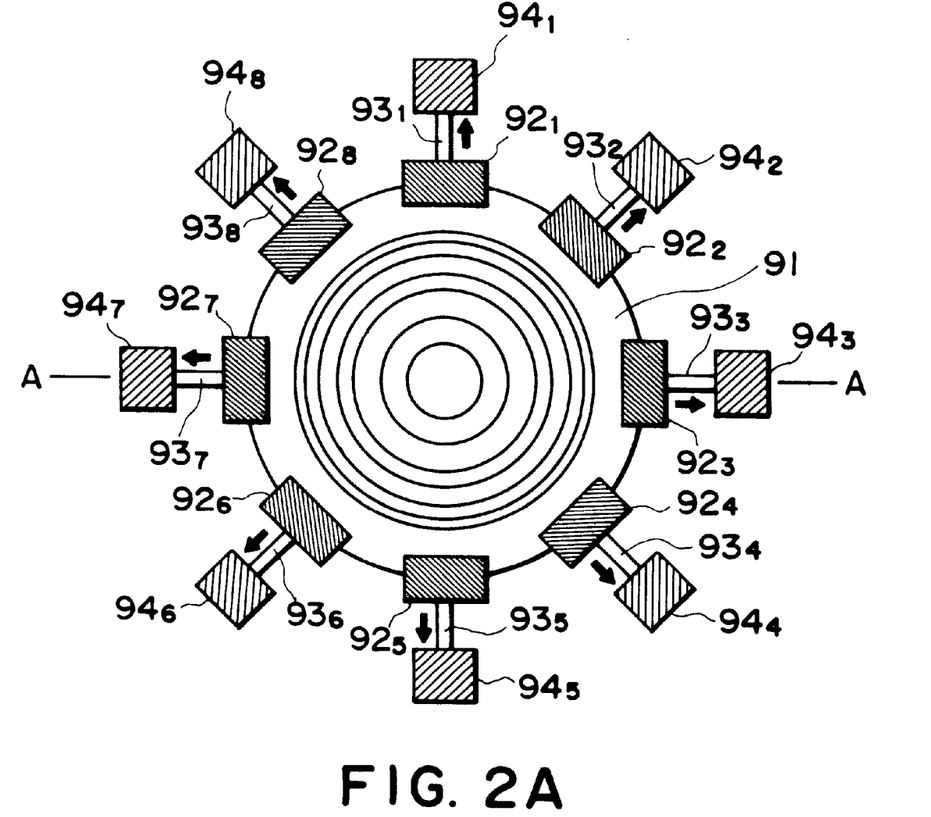
FIGS. 2A and 2B are schematic views, respectively, for explaining an optical arrangement according to a first embodiment of the present invention.
Figure 2B:
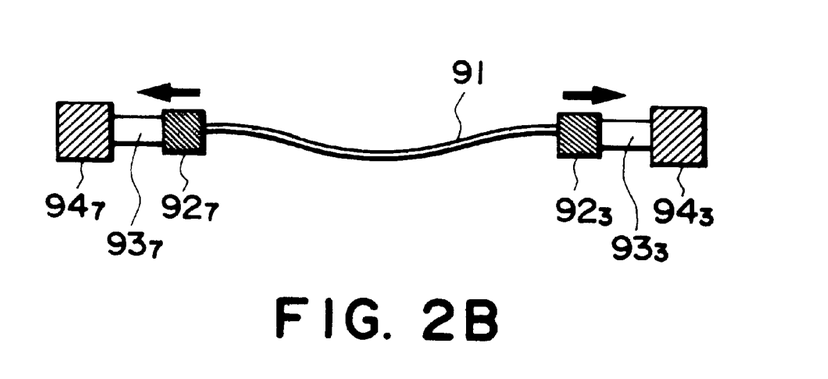

FIGS. 2A and 2B are schematic views, respectively, for explaining an optical arrangement according to a first embodiment of the present invention, wherein FIG. 2A is a plan view and FIG. 2B is a sectional view taken along a line A—A in FIG. 2A. In FIG. 2B, curvature of a diffractive optical element is illustrated with exaggeration.

Denoted in these drawings at 91 is a diffractive optical element. Denoted at $92_i$ (i=1 to 8) is an element holding member, and denoted at $93_i$ (i=1 to 8) is a piezoelectric device. Denoted at $94_i$ (i=1 to 8) is a barrel connecting member. As illustrated, the diffractive optical element 91 is held by eight element holding members $92_1$–$92_8$ disposed along its periphery. Each element holding member 92i is connected to a barrel (not shown) through a piezoelectric device (expansion/contraction member) $93_i$ and a barrel connecting member $94_i$. The piezoelectric device $93_i$ is adapted to be expanded or contracted in response to an applied voltage, applied from curvature control means (not shown), to thereby move the element holding member $92_i$ minutely.

When the element holding member $92_i$ is actuated to push the diffractive optical element 91 in a direction toward the center thereof (i.e., to contract the same), the diffractive optical element 91 is curved or flexed minutely. Also, when the diffractive optical element is pulled outwardly as depicted by arrows, the flatness of the diffractive optical element 91 increases, and gravity deformation thereof, for example, due to the gravity can be corrected.

In this embodiment, as described, a plurality of piezoelectric devices 93i are fixedly connected each at one end to -the diffractive optical element 91 side while the other end is fixedly connected to the barrel side. The piezoelectric devices $93_i$ are controlled by the curvature control means, to minutely change the magnitude or curvature of the diffractive optical element 91. This effectively causes a change in optical characteristic of the diffractive optical element 91, and thus a change in optical characteristic of an optical system that includes the diffractive optical element 91. In FIG. 2A, different voltages may be applied to those piezoelectric devices which are effective to pull the diffractive optical element upwardly and downwardly in FIG. 2A, and those piezoelectric devices which are effective to pull the diffractive optical element rightwardly and leftwardly. On that occasion, the diffractive optical element 91 may be curved into a cylindrical surface shape, by which astigmatism of the optical system including the diffractive optical element 91 can be corrected.

While this embodiment uses piezoelectric devices, any other mechanism other than the piezoelectric devices which is effective to push or pull the peripheral portion of the diffractive optical element 91 physically (i.e., the length can be expanded or contracted thereby) may be used.

Embodiment 2

Figure 3:
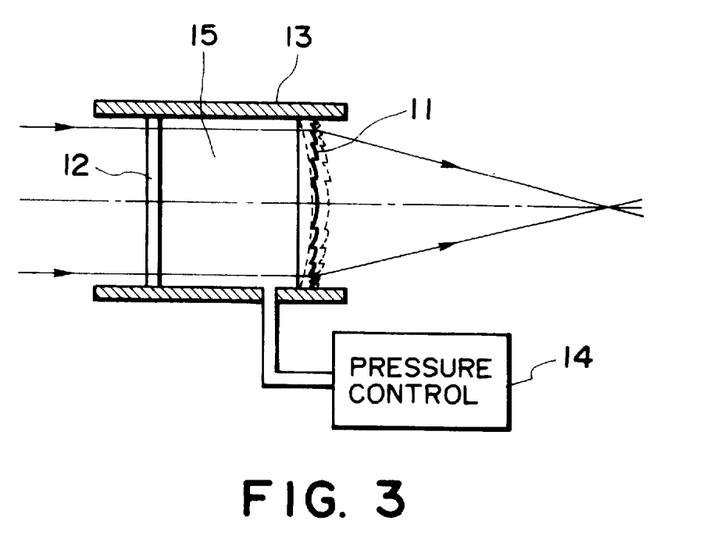
FIG. 3 is a schematic view for explaining an optical arrangement according to a second embodiment of the present invention.

FIG. 3 is a schematic view for explaining an optical arrangement according to a second embodiment of the present invention. Denoted in the drawing at 11 is a diffractive optical element, and denoted at 12 is an optical element such as a parallel flat glass plate or a lens, for example. Denoted at 13 is a barrel (holding means), and denoted at 14 is a pressure control system (curvature control means). The diffractive optical element 11 and optical element 12 are components of an optical system. Each of the diffractive optical element 11 and the optical element 12 is fixed to the barrel 13 without a gap. Thus, the space 15 enclosed by the barrel 13, the diffractive optical element 11 and the optical element 12 is closed by a gas-tight structure. The space is communicated with a pressure control system 14 through a hole formed in the bottom of the barrel. The pressure control system 14 serves to evacuate the gas from or discharge a gas into the space 15, to control the space 15 at a desired gas pressure to change the magnitude of curvature of the diffractive optical element 11.

When the space 15 is pressurized, the diffractive optical element 11 is curved outwardly minutely, such that an on-axis spherical aberration is produced in the negative direction. When the space 15 is de-pressurized, the diffractive optical element 11 is curved inwardly minutely, and an off-axis spherical aberration is produced in the positive direction. By changing the magnitude of the diffractive optical element 11 in this manner, the spherical aberration of the whole optical system can be corrected. Distortion aberration, curvature aberration and magnification of the whole optical system can be controlled minutely, essentially in the same manner.

The space 15 may be filled with an inert gas such as nitrogen gas, and the pressure control may be performed by using such gas. This may be effective to avoid damaging of the elements that define the space.

Figure 4:
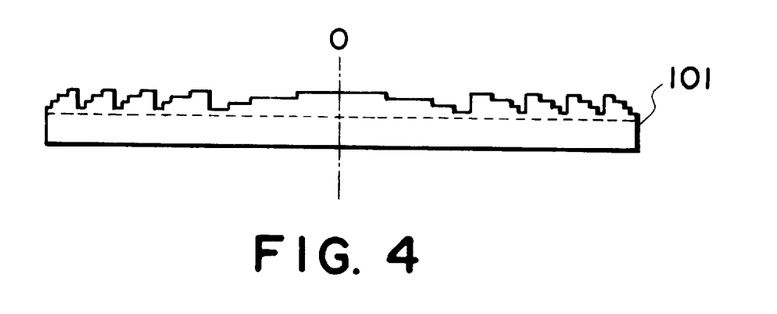
FIG. 4 is a sectional view of a diffractive optical element usable in embodiments of the present invention.

FIG. 4 is a sectional view of a diffractive optical element which can be used in the embodiments such as described above. This diffractive optical element 101 comprises a binary optics element which can be provided by a phase type diffraction grating having its glass substrate surface formed into a step-like shape by a lithography process. In this example, the diffractive optical element 101 has a revolutionally symmetrical shape with respect to an optical axis 0.

For details of such a binary type diffractive optical element, reference may be made to be following publications:

a) G. J. Swanson, "Binary Optics Technology: The Theory and Design of Multi-level Diffractive Optical Elements", Massachusetts Institute of Technology Lincoln Laboratory, Technical Report 854, Aug. 14, 1989.

b) G. J. Swanson, "Binary Optics Technology: Theoretical Limits on the Diffraction Efficiency of Multilevel Diffractive Optical Elements", Massachusetts Institute of Technology Lincoln Laboratory, Technical Report 914, Mar. 1, 1991.

Figure 5:
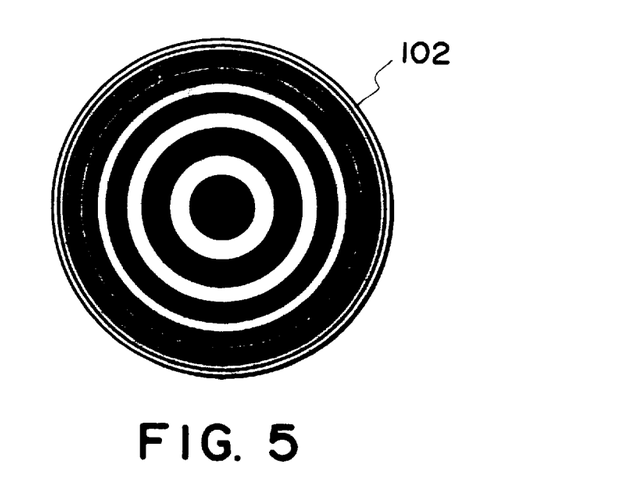
FIG. 5 is a plan view of another diffractive optical element usable in embodiments of the present invention.

FIG. 5 is a plan view of another diffractive optical element which can be used in the embodiments such as described above. This diffractive optical element 101 comprises a Fresnel zone plate. This Fresnel zone plate can be provided by depositing a metal film such as chromium, for example, on a glass substrate and by defining Fresnel zones by means of a lithographic process, like the diffractive optical element 11, to form light blocking areas (with the remaining metal film) and light transmitting areas (without a film) thereon. Thus, it is a parallel flat plate in the sectional shape. The optical function of this Fresnel zone plate is essentially the same as that of the diffractive optical element 11 of FIG. 4, except that the transmissivity is slowed down.

Figure 6:
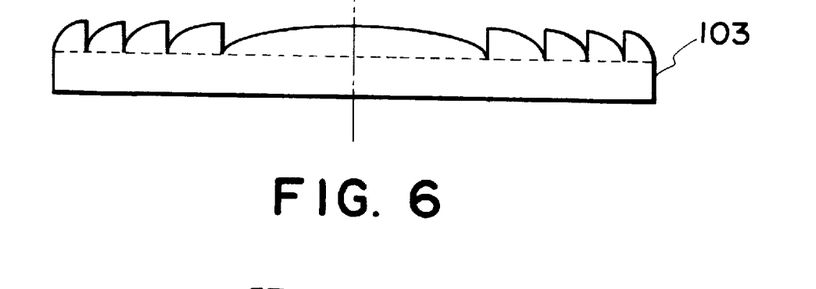
FIG. 6 is a sectional view of a further diffractive optical element usable in embodiments of the present invention.

FIG. 6 is a sectional view of another diffractive optical element which can be used in the embodiments of the present invention such as described above. This diffractive optical element 103 has a shape which is revolutionally symmetrical with respect to the optical axis 0. The diffractive optical element 103 comprises a phase Fresnel zone plate which has a plurality of rings, and each ring has a continuously curved surface. At the boundary between adjacent rings, there is a discontinuity such that there occurs a phase shift of wavefront, passed through The diffractive optical element 103, by an amount of $2\pi$. The diffractive optical element 103 can be provided by cutting or press forming. The operation and function of the diffractive optical element is essentially the same as that of the diffractive optical element 101 of FIG. 4.

Embodiment 3

Figure 7:
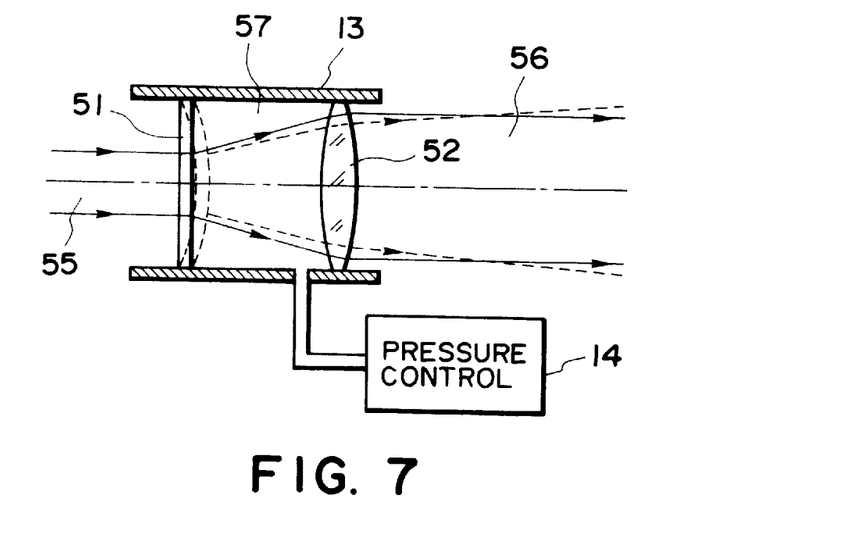
FIG. 7 is a schematic view for explaining an optical arrangement according to a third embodiment of the present invention.

FIG. 7 is a schematic view of an optical arrangement according to a third embodiment of the present invention. Denoted in the drawing at 51 is a diffractive optical element having a negative refractivity (power), and denoted at 52 is a lens (optical element) juxtaposed to the diffractive optical element 51. Denoted at 13 is a barrel, and denoted at 14 is a pressure control system (curvature control means). Denoted at 55 is input light, and denoted at 56 is output light. Each of the diffractive optical element 51 and the lens 52 is fixedly connected to the barrel 13 without a gap. Thus, the space 57 enclosed by the barrel 13, the diffractive optical element 51 and the lens 52 is closed by a gas-tight structure. The space is communicated with a pressure control system 14 through a hole formed in the bottom of the barrel. The pressure control system serves to evacuate the gas (e.g., nitrogen gas) from or discharge a gas into the space 57 to thereby control the space 57 at a desired pressure.

In this embodiment, the diffractive optical element 51 and the lens 52 provide an optical system equivalent to a beam expander.

When the space 57 is de-pressurized by means of the pressure control system 14, the central portion of the diffractive optical element 51 is curved or flexed in a direction toward the convex lens, such that the output light 56 can be adjusted into a direction of divergence. When the space 57 inside is pressurized, on the other hand, the central portion of the diffractive optical element 51 is curved in a direction away from the convex lens, such that the output light 56 can be adjusted into a direction of convergence. Namely, by controlling the pressure of the space 57 through the pressure control system 14, the magnitude of curvature of the diffractive optical element 51 can be controlled, whereby the state of emission of the output light 56 from the optical system (i.e., optical characteristic) can be controlled.

Embodiment 4

Figure 8:
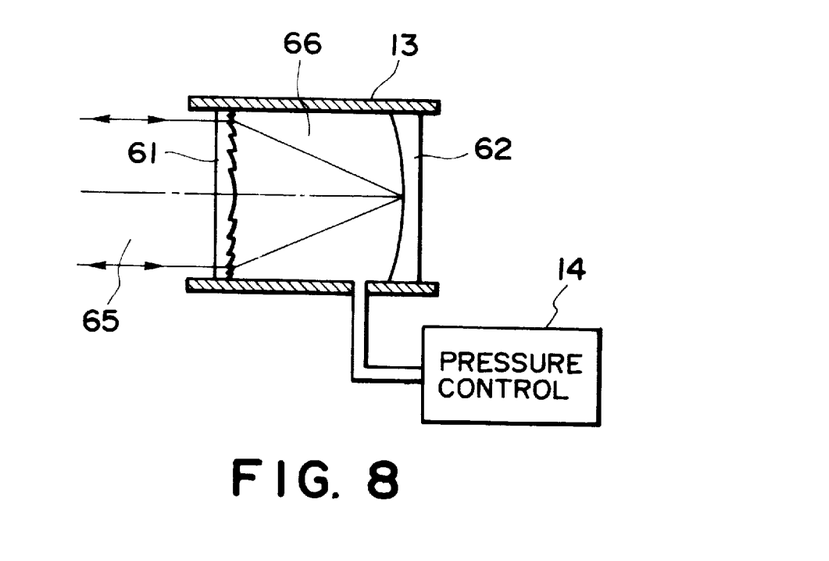
FIG. 8 is a schematic view for explaining an optical arrangement according to a fourth embodiment of the present invention.

FIG. 8 is a schematic view for explaining an optical arrangement according to a further embodiment of the present invention. Denoted in the drawing at 61 is a diffractive optical element, and denoted at 62 is a reflection mirror having a concave surface. Denoted at 13 is a barrel, and denoted at 14 is a pressure control system (curvature control means). Denoted at 65 is light.

Each of the diffractive optical element 61 and the reflection mirror 62 is fixedly connected to the barrel 13 without a gap. Thus, tile space 66 enclosed by the barrel 13, the diffractive optical element 61 and the reflection mirror 62 is closed by a gas-tight structure. The space is communicated with a pressure control system 14 through a hole formed in the bottom of the barrel. In this embodiment, the diffractive optical element 61 and the reflection mirror 62 provide a cat's eye optical system wherein the light incident thereon is emitted back along the direction of incidence.

The pressure control system 14 serves to evacuate the gas (e.g., nitrogen gas) from or discharge a gas into the space 66 to thereby control the space 57 at a desired pressure. Through the pressure control by the pressure control system 14, the magnitude of curvature of the diffractive optical element 61 can be changed, and the optical characteristic of the light 56 reflected and emitted can be controlled.

Embodiment 5

Figure 9:
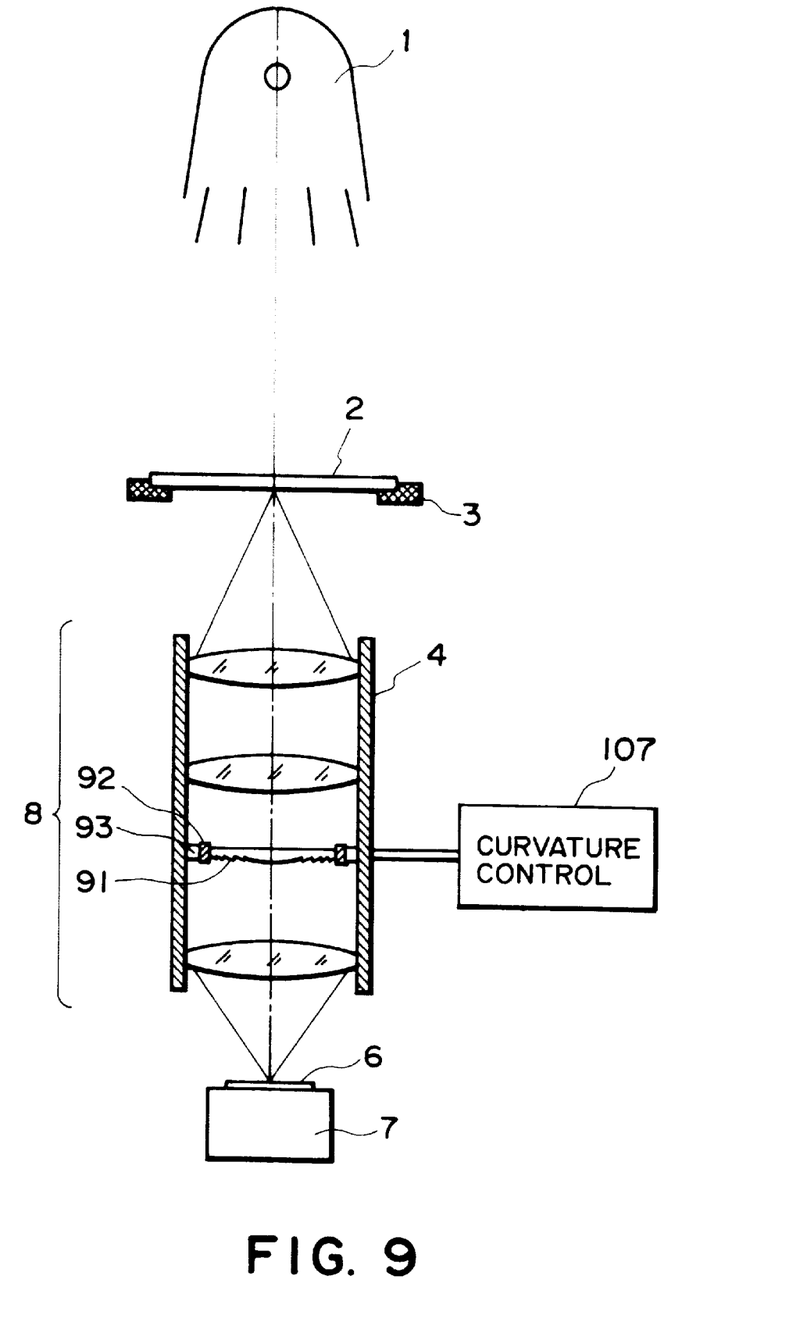
FIG. 9 is a schematic view for explaining an optical arrangement according to a fifth embodiment of the present invention.

FIG. 9 is a schematic view of a main portion of an exposure apparatus, according to an embodiment of the present invention. In this embodiment, the invention is applied to an exposure apparatus for the manufacture of semiconductor devices. Denoted in the drawing at 1 is a light source, and denoted at 2 is a reticle. Denoted at 3 is a reticle stage, and denoted at 4 is a barrel. Denoted at 91 is a diffractive optical element, and denoted at 92 is an element holding member. Denoted at 93 is a piezoelectric device (expandable/contractible member). The barrel 4 and the diffractive optical element 91 are components of a projection lens (projection optical system) 8. Denoted at 107 is a curvature control system. Denoted at 6 is a wafer, and denoted at 7 is a wafer stage. The piezoelectric device 93 and the curvature control system 107 are components of curvature control means. In this embodiment, the optical arrangement according to the first embodiment is incorporated when the diffractive optical element 91 is mounted within the projection lens 8.

The piezoelectric device 93 can be expanded or contracted in response to an applied voltage, applied from the curvature control system 107, to move the element holding member 92 minutely. When the diffractive optical element 91 is pushed inwardly (contracted) by means of the element holding member 92, the diffractive optical element 91 is curved minutely. When it is pulled outwardly, the flatness of the diffractive optical element increases, such that gravity deformation thereof, for example, due to the gravity, can be corrected.

In operation of this embodiment, first the wafer 6 is positioned at a desired position by means of the wafer stage 7. Then, through focus detecting means (not shown), the water height (level) is adjusted with respect to the focus position.

Here, the curvature control system 107 controls the applied voltage to the piezoelectric device 93 (there are a plurality of piezoelectric devices around the diffractive optical element 91), to control the curvature shape of the diffractive optical element 91 minutely. By this, the optical characteristic of the projection lens such as distortion aberration or magnification, for example, can be corrected. The optical characteristic referred to above may not be an absolute value of distortion or magnification, but it may be a relative value in relation to a pattern of a layer already printed on a wafer.

After the correction is completed, a shutter (not shown) is opened and the reticle 2 is illuminated with illumination light from the light source 1. By this, the circuit pattern of the reticle 2 is projected and transferred onto the wafer 6, through the projection lens 4.

Embodiment 6

Figure 10:
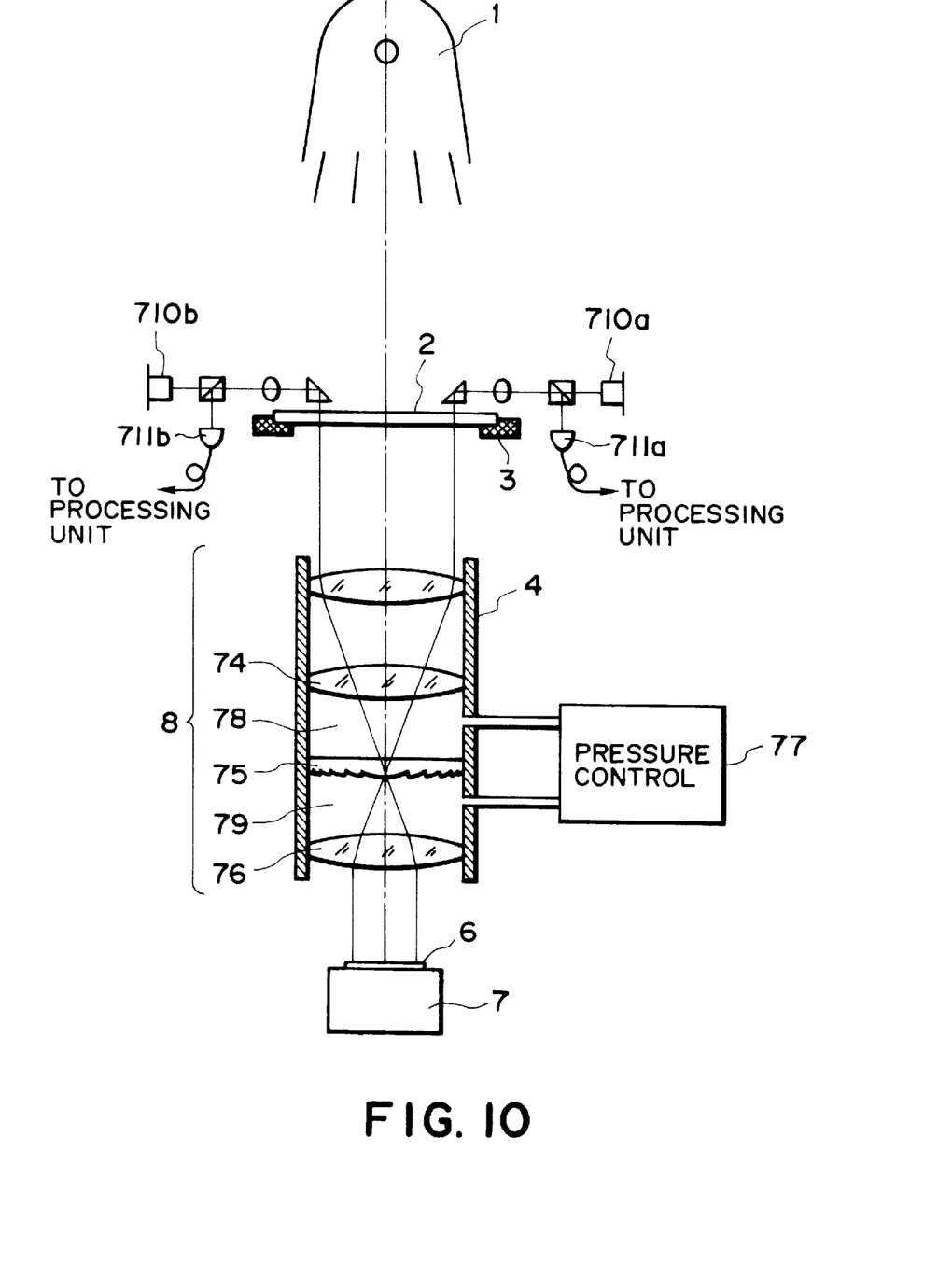
FIG. 10 is a schematic view for explaining an optical arrangement according to a sixth embodiment of the present invention

FIG. 10 is a schematic view of a main portion of an exposure apparatus according to another embodiment of the present invention. In this embodiment, the invention is applied to an exposure apparatus for the manufacture of semiconductor devices. Denoted in the drawing at 1 is a light source, and denoted at 2 is a reticle. Denoted at 3 is a reticle stage, and denoted at 4 is a barrel. Denoted at 75 is a diffractive optical element, and denoted at 74 and 76 are lenses juxtaposed to the diffractive optical element 75. The barrel 4, the diffractive optical element 75 and the lenses 74 and 76 are components of the projection lens (optical system) 8. Denoted at 77 is a pressure control system (curvature control means). Denoted at 6 is a wafer, arid denoted at 7 is a wafer stage. Denoted at 710a and 710b are light sources for optical characteristic detection, and denoted at 711a and 711b are detectors for optical characteristic detection. The light sources 710a and 710b and the detectors 711a and 711b are components of an alignment detecting system. This alignment detecting system and a processing unit (not shown) are components of an optical characteristic detecting system (optical characteristic measuring means).

In this embodiment, an optical arrangement according to the second embodiment is incorporated into the projection lens 8.

The space 79 as enclosed by the barrel 4, the lens 74 and the diffractive optical element 75 as well as the space 79 as enclosed by the barrel 4, the lens 76 and the diffractive optical element 75 are closed by a gas-tight structure, and no gas leakage occurs except at the holes being communicated with the pressure control system 77.

In operation of this embodiment, first the wafer 6 is positioned at a desired position by means of the wafer stage 7. Then, through focus detecting means (not shown), the wafer height is adjusted with respect to the focus position.

Here, by using the alignment detecting system, alignment marks formed on a layer having already been exposed or printed on the wafer are detected, and the wafer 6 is brought into alignment with the reticle 2. More specifically, the light emitted from the light source 710a (710b) is projected through a triangle prism onto the projection lens 8, and after passing the projection lens, it illuminates an alignment mark on the wafer 6. Then, light reflected by the alignment mark goes through the projection lens and, via the triangle prism, an image of the alignment mark is formed on the detector 711a (711b). Usually, the image of the alignment mark as formed on the detector 711a (711b) is deviated from the position of a corresponding alignment mark of the reticle 2. Thus, the wafer stage 2 is actuated so that the alignment marks are brought into registration upon the detector 711a (711b). Then, the alignment operation is completed. However, there may be a case where the alignment marks of the wafer 6 and the reticle 2 are in registration upon the detector 711a, for example, whereas two alignment marks are never in registration upon the detector 711b, for example. This may be attributable to a change in optical characteristic of the projection lens, resulting from a change in environment such as temperature or humidity, or from absorption of exposure light energy by the projection lens, causing a small change in distortion aberration or imaging magnification of the projection lens.

In this embodiment, in such a case, such misregistration (alignment error) that cannot be corrected by the alignment operation is utilized, and it is detected by use of the processing means as a current optical characteristic of the projection lens. The misregistration or error referred to above may not correspond to an absolute value of distortion or magnification, and it may be a relative value in relation to a pattern of a layer already printed on the wafer.

In accordance with the optical characteristic value as detected, the pressure control system 77 controls the pressures in the spaces 78 and 79 to produce curvature of the diffractive optical element 75, to change the optical characteristic of the projection lens 8. The optical characteristic value detection (alignment measurement) and the optical characteristic change through the pressure control are repeated, and correction of the optical characteristic is completed.

After the correction is completed, a shutter (not shown) is opened, and the reticle 2 is illuminated with illumination light from the light source 1. By this, the pattern of the reticle 2 is projected and transferred onto the wafer 6 through the projection lens 8.

The pressure control system 77 of this embodiment may be equipped with an additional function, causing a decrease in the number of repetitions of the optical characteristic detection and pressure control. That is, correlation information between the pressure (control amount) and the optical characteristic may be stored in the pressure control system 77, and a necessary pressure control magnitude may be calculated from the measured value of the optical characteristic, a desired value of the optical characteristic and the correlation information. On the basis of the thus calculated value, the pressure control may be performed. This directly corrects the optical characteristic to a desired value, without repetition. This effectively reduces the time necessary for the optical characteristic control.

Embodiment 7

Figure 11:
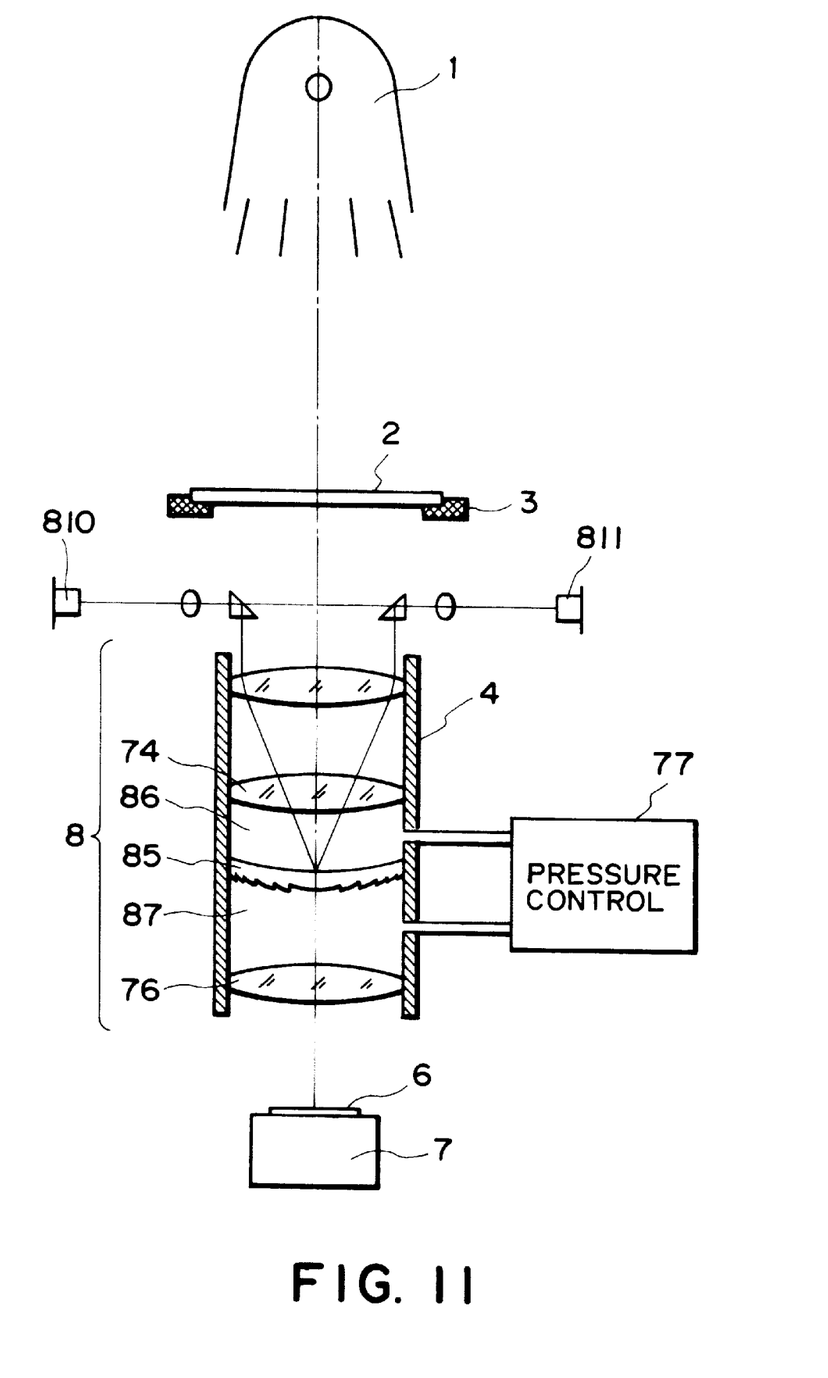
FIG. 11 is a schematic view for explaining an optical arrangement according to a seventh embodiment of the present invention.

FIG. 11 is a schematic view of a main portion of an exposure apparatus according to another embodiment of the present invention in this embodiment, the invention is applied to an exposure apparatus for the manufacture of semiconductor devices. Denoted in the drawing at 1 is a light source, and denoted at 2 is a reticle. Denoted at 3 is a reticle stage, and denoted at 4 is a barrel. Denoted at 85 is a diffractive optical element, and denoted at 84 and 86 are lenses juxtaposed to the diffractive optical element 85. The barrel 4, the diffractive optical element 85 and the lenses 84 and 86 are components of the projection lens (optical system) 8. Denoted at 77 is a pressure control system (curvature control means). Denoted at 6 is a wafer, and denoted at 7 is a wafer stage. Denoted at 810 is a light source for measurement of the shape of the diffractive optical element 85, and denoted at 811 is a detector for the shape measurement. The light source 810 aid the detector 811 are components of a shape measuring system (shape measuring means).

The space 86 as enclosed by the lens 74, the barrel 4 and the diffractive optical element 85 as well as the space 87 as enclosed by the barrel 4, the lens 76 and the diffractive optical element 85 are closed by a gas-tight structure, and no gas leakage occurs except at the holes being communicated with the pressure control system 77.

In operation of this embodiment, first the wafer 6 is positioned at a desired position by means of the wafer stage 7. Then, through focus detecting means (not shown), the wafer height is adjusted with respect to the focus position.

The shape measuring system serves to measure the shape of the diffractive optical element 85. More specifically, the light from the light source 810 is divided into two beams. One is projected through a triangle prism onto the projection lens and illuminates the surface of the diffractive optical element 85. Light reflected thereby is directed via the triangle prism onto the detector 811. On the basis of measurement of an interference between this reflected light and the other beam or of measurement of the relative position of the reflected beam, the position of the reflection point of the diffractive optical element 85 is measured. Based on this measurement, the state of the shape of the diffractive optical element 85 is detected. The shape measuring system may have a structure different from this.

In accordance with the value of the current shape of the diffractive optical element 85, having been measured through the shape measuring system, the pressure control system 77 controls the pressures in the spaces 86 and 87 above and below the diffractive optical element 85, to change the magnitude of curvature of the diffractive optical element 85. The shape control based on the measured shape value and pressure control is repeated, and the shape of the diffractive optical element 85 is controlled into a desired one. By this, the optical characteristic of the projection lens 8 can be corrected to a desired one.

After the shape correction is completed, a shutter (not shown) is opened, and the reticle 2 is illuminated with illumination light from the light source 1. By this, the pattern of the reticle 2 (first object) is projected and transferred onto the wafer 6 through the projection lens 8.

The pressure control system 77 of this embodiment may be equipped with an additional function, causing a decrease in the number of repetitions of the shape measurement and pressure control. That is, correlation information between the pressure (control amount) and the magnitude of curvature may be stored in the pressure control system 77, and a necessary pressure control magnitude may be calculated from the measured value of shape, a desired value of the optical characteristic and the correlation information. On the basis of the thus calculated value, the pressure control may be performed. This directly corrects the shape of the diffractive optical element to a desired one, without repetition. This effectively reduces the time necessary for the shape control.

In the embodiments wherein the shape of a diffractive optical element is controlled by using a pressure control system, the space closed by a gas-tight structure may be filled with an inert gas, and the pressure control may be performed by using the inert gas. This enables an exposure apparatus which has a high transmissivity to exposure wavelength and which is stable and less degraded with contamination of a lens or a diffractive optical element. For such an inert gas, a nitrogen gas or a rare gas such as helium gas may be used.

Embodiment 8

Figure 12:
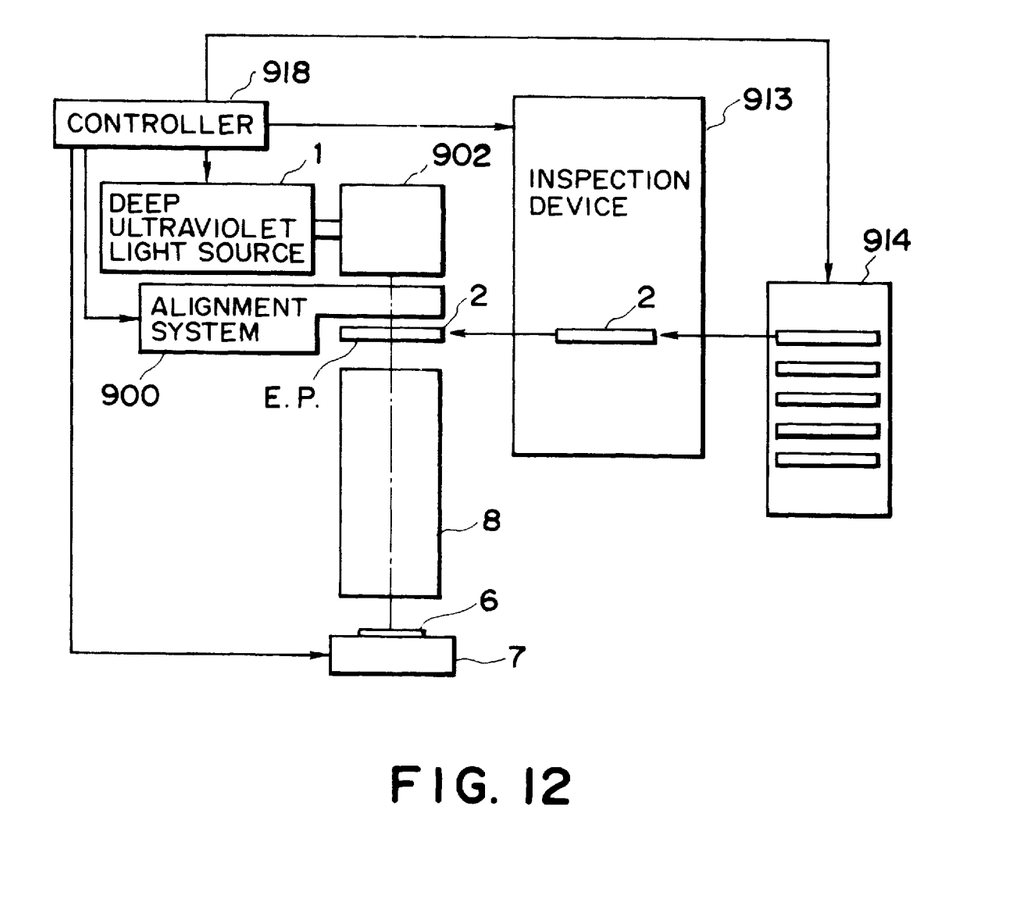
FIG. 12 is a schematic view of a main portion of a semiconductor device manufacturing system, including an exposure apparatus according to any one of the fifth to seventh embodiments of the present invention.

FIG. 12 is a schematic view of a main portion of a semiconductor device manufacturing system which uses an exposure apparatus according to one of the fifth to seventh embodiments of the present invention. The system of this embodiment is adapted for the manufacture of semiconductor devices, including a process for printing a circuit pattern of an original such as a reticle or photomask onto a wafer. The system generally includes an exposure apparatus, an accommodating unit for an original, an inspection system for an original, and a controller, which are disposed within a clean room.

Denoted in the drawing at 1 is a deep ultraviolet light source such as an excimer laser. Denoted at 902 is a unit of an illumination system (illuminating means). These components serve to illuminate a reticle 2, placed at the exposure position EP, from above and with a predetermined numerical aperture (NA). Denoted at 8 is a projection lens such as that of the fifth to seventh embodiments. It serves to project and print the circuit pattern, formed on the reticle 2, onto the wafer 6 which may comprise a silicon substrate.

Denoted at 900 is an alignment system for aligning the original 2 and the wafer 6, prior to the exposure operation. The alignment system 900 includes at least one original observation microscope. Denoted at 7 is a wafer stage. These components constitute the exposure apparatus.

Denoted at 914 is a reticle accommodating system, and a plurality of originals (reticles) are stored therein. Denoted at 913 is an inspection system for detecting the presence/absence of any foreign particle on a reticle. This inspection system 913 performs particle inspection to a reticle, before the reticle as selected and unloaded from the accommodating system 914 is placed at the exposure position EP.

The controller controls the sequences of the system as a whole. It controls operation signals for the accommodating system 914 and the inspection system 913 as well as sequences for the alignment and exposure operation and wafer stepwise feeding, for example.

Next, the semiconductor device manufacturing processes to be performed by use of the semiconductor device manufacturing system of this embodiment, will be explained.

Figure 13:
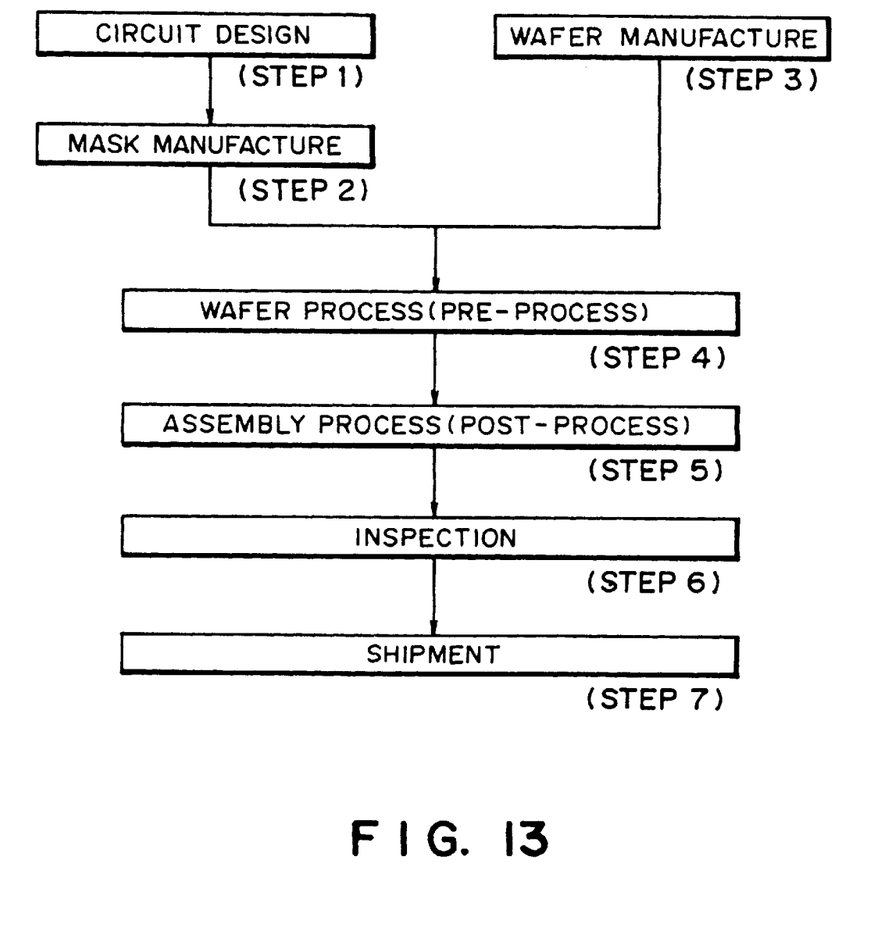
FIG. 13 is a flow chart of semiconductor device manufacturing processes.

FIG. 13 is a flow chart of a procedure for the manufacture of microdevices such as semiconductor chips (e.g., ICs or LSIs), liquid crystal panels, or CCDs, for example.

Step 1 is a design process for designing a circuit of a semiconductor device. Step 2 is a mask production process for making a mask (reticle 2) on the basis of the circuit pattern design. Step 3 is a process for preparing a wafer 6 by using a material such as silicon. Step 4 is a wafer process which is called a pre-process wherein, by using the so prepared mask and wafer, circuits are practically formed on the wafer through lithography. Step 5 subsequent to this is an assembling step which is called a post-process wherein the wafer having been processed by step 4 is formed into semiconductor chips. This step includes an assembling (dicing and bonding) process and a packaging (chip sealing) process. Step 6 is an inspection step wherein an operation check, a durability check and so on for the semiconductor devices provided by step 5, are carried out. With these processes, semiconductor devices are completed and they are shipped (step 7).

Figure 14:
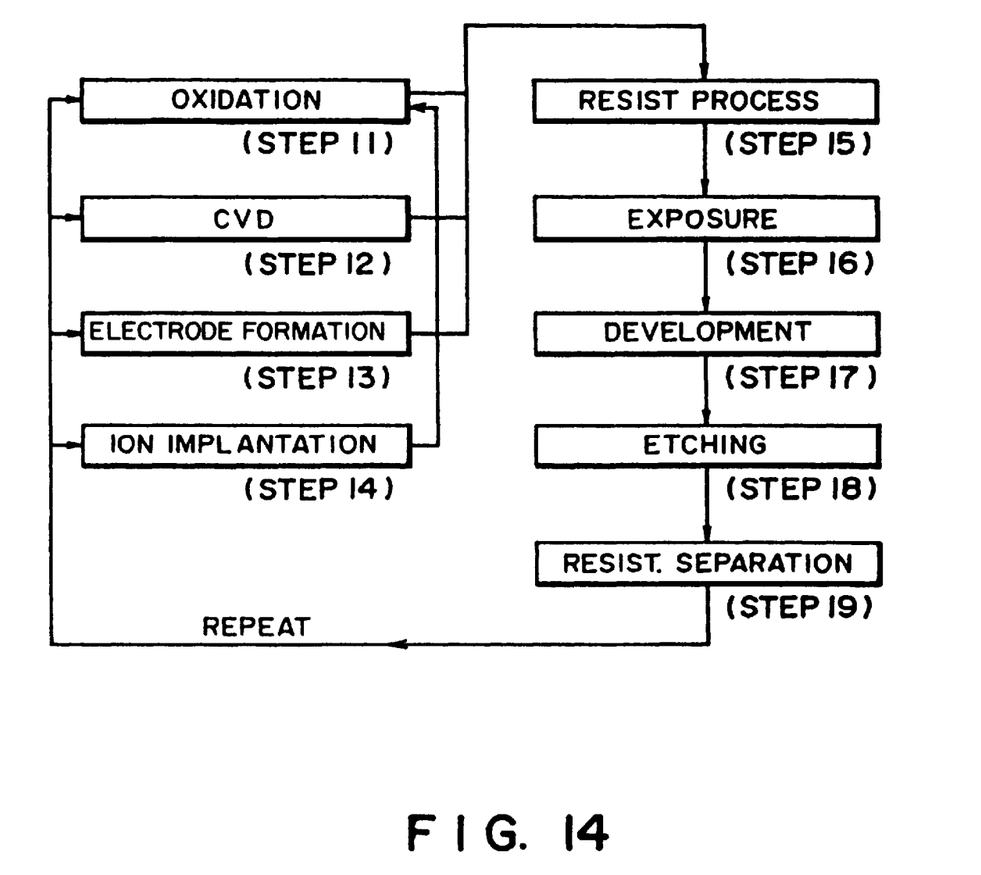
FIG. 14 is a flow chart for explaining details of a wafer process.

FIG. 14 is a flow chart showing details of the wafer process.

Step 11 is an oxidation process for oxidizing the surface of a wafer 6. Step 12 is a CVD process for forming an insulating film on the wafer surface. Step 13 is an electrode forming process for forming electrodes upon the wafer by vapor deposition Step 14 is an ion implanting process for implanting ions to the wafer. Step 15 is a resist process for applying a resist (photosensitive material) to the wafer. Step 16 is an exposure process for printing, by exposure, the circuit pattern of the mask (reticle 2) on the wafer through the exposure apparatus described above. Step 17 is a developing process for developing the exposed wafer. Step 18 is an etching process for removing portions other than the developed resist image. Step 19 is a resist separation process for separating the resist material remaining on the wafer after being subjected to the etching process.

As illustrated, these processes are repeated, whereby circuit patterns are formed on the wafer.

Now, the exposure process at step 16 will be explained in greater detail. In the exposure apparatus of FIG. 12, a reticle 2 to be used is unloaded from the accommodating system 914, and it is placed in the inspection system 913.

Then, particle inspection of the original 2 is performed by the inspection system 913. It the result is that no particle is present on the reticle, the original is moved to the exposure position EP in the exposure apparatus.

Subsequently, a wafer 6 to be exposed is placed on the wafer stage 7. Then, the reticle 2 and the wafer 6 are brought into alignment with each other by means of the alignment system 900. After this, a pattern of the original 2 is projected and printed, in a reduced scale, on one region on the wafer 6. Then, the wafer is moved stepwise by the wafer stage, by an amount corresponding to one chip, and the above-described operations are repeated. In accordance with the step-and-repeat exposures described above, the pattern of the original 2 is printed on all the regions of the wafer 6 through projection exposure.

After exposure of the whole surface of one wafer 6 is completed, it is collected and a fresh wafer is supplied. Step-and-repeat exposure (printing) of the pattern of the original is performed in a similar way.

After the exposure process is completed, an exposed safer having been exposed is conveyed to a next developing process.

In accordance with the projection exposure apparatus of this embodiment, the optical system can provide a high resolving power. Thus, a semiconductor device of high density integration, with a very thin circuit pattern, can be produced.

It is to be noted that the optical arrangement of the present invention is not limited to use in an exposure apparatus. It may be used widely in ordinary optical instruments.

While the invention has been described with reference to the structures disclosed herein, it is not confined to the details set forth and this application is intended to cover such modifications or changes as may come within the purposes of the improvements or the scope of the following claims.

What is claimed is:

1. An optical apparatus, comprising:
   a diffractive optical element having a variable curvature, wherein said diffractive optical element has a relief type diffraction grating, of which a grating pitch decreases from a center toward an edge thereof; and
   curvature varying means for varying the curvature of said diffractive optical element.

2. An optical apparatus according to claim 1, wherein said curvature varying means pushes or pulls a peripheral edge portion of said diffractive optical element to thereby change the curvature of said diffractive optical element.

3. An optical apparatus according to claim 1, wherein said curvature varying means varies a pressure, applied to a surface of said diffractive optical element, to thereby change the curvature of the surface of said diffractive optical element.

4. An optical apparatus according to claim 3, further comprising a second optical element and holding means for holding said second optical element, wherein said second optical element, said diffractive optical element and said holding means define a space, which is gas-tightly closed, and wherein said curvature varying means varies a pressure in the space to thereby vary the curvature of said diffractive optical element.

5. An optical apparatus according to claim 4, wherein the space is filled with an inert gas.

6. An optical apparatus according to claim 1, further comprising measuring means for measuring the curvature of said diffractive optical element, wherein said varying means varies the curvature of said diffractive optical element on the basis of the measurement by said measuring means.

7. An optical apparatus according to claim 6, further comprising memorizing means for storing correlation information about a control amount of said varying means and the curvature of said diffractive optical element, wherein said varying means varies the curvature of said diffractive optical element on the basis of a control amount determined in accordance with the measurement by said measuring means and the correlation information stored by said memorizing means.

8. An exposure apparatus, comprising:
   illuminating means for illuminating a mask having a pattern formed thereon; and
   projecting means for projecting the pattern of the mask onto a wafer, said projecting means including (i) a diffractive optical element having a variable curvature, wherein said diffractive optical element has a relief type diffraction grating, of which a grating pitch decreases from a center toward an edge thereof, and (ii) varying means for varying the curvature of said diffractive optical element.

9. An apparatus according to claim 8, wherein said varying means pushes or pulls a peripheral edge portion of said diffractive optical element to thereby change the curvature of said diffractive optical element.

10. An apparatus according to claim 8, wherein said varying means varies a pressure, applied to at least one surface of said diffractive optical element, to thereby change the curvature of said diffractive optical element.

11. An apparatus according to claim 10, further comprising a second optical element and holding means for holding said second optical element, wherein said second optical element, said diffractive optical element and said holding means define a space which is gas-tightly closed, and said varying means varies a pressure in the space to thereby change the curvature of said diffractive optical element.

12. An apparatus according to claim 11, wherein the space is filled with an inert gas.

13. An apparatus according to claim 8, further comprising optical characteristic measuring means for measuring an optical characteristic of said projecting means, wherein said varying means varies the curvature of said diffractive optical element on the basis of the measurement by said optical characteristic measuring means.

14. An apparatus according to claim 13, further comprising memorizing means for storing correlation information about a control amount of said varying means and the optical characteristic of said projecting means, wherein said varying means controls the magnitude of curvature of said diffractive optical element on the basis of a control amount determined in accordance with the measurement by said optical characteristic measuring means and the correlation information stored by said memorizing means.

15. An apparatus according to claim 13, wherein said optical characteristic measuring means includes alignment detecting means for detecting an alignment error between the mask and the wafer, and said optical characteristic measuring means determines the optical characteristic of said projecting means on the basis of the alignment error detected by said alignment detecting means.

16. An apparatus according to claim 8, further comprising measuring means for measuring the curvature of the surface of said diffractive optical element, wherein said varying means varies the curvature of the surface of said diffractive optical element on the basis of the measurement by said measuring means.

17. An apparatus according to claim 16, further comprising memorizing means for storing correlation information about a control amount of said varying means and the curvature of said diffractive optical element, wherein said varying means varies the curvature of said diffractive optical element on the basis of a control amount determined in accordance with the measurement by said measuring means and the correlation information stored by said memorizing means.

18. A device manufacturing method, comprising the steps of:
   providing an exposure apparatus as recited in any one of claims 8 to 17;

illuminating, by the illuminating means, a mask having a device pattern formed thereon;

projecting, by the projecting means, the pattern of the mask onto a wafer, to print an image of the device pattern of the mask onto the wafer; and developing the wafer.

19. An optical apparatus, comprising:

a diffractive optical element having a variable curvature, wherein said diffractive optical element has a relief type diffraction grating, of which a grating pitch decreases from a center toward an edge thereof; and varying means for varying a pressure applied to at least one surface of said diffractive optical element, to thereby change a curvature of said diffractive optical element.

20. An apparatus according to claim 19, further comprising a second optical element, and holding means for holding said second optical element, wherein said second optical element, said diffractive optical element and said holding means define a space, which is gas-tightly closed, and said varying means varies a pressure in the space to thereby change the curvature of the at least one surface of said diffractive optical element.

21. An apparatus according to claim 20, wherein the space is filled with an inert gas.

22. An optical apparatus, comprising:

a diffractive optical element having a variable curvature, wherein said diffractive optical element has a relief type diffraction grating, of which a grating pitch decreases from a center toward an edge thereof;

measuring means for measuring a curvature of said diffractive optical element; and varying means for varying the curvature of said diffractive optical element on the basis of the measurement by said measuring means.

23. An apparatus according to claim 22, further comprising memorizing means for storing correlation information about a control amount of said varying means and the curvature of said diffractive optical element, wherein said varying means varies the curvature of said diffractive optical element on the basis of a control amount determined in accordance with the measurement by said measuring means and the correlation information stored by said memorizing means.

24. An optical apparatus, comprising:

a diffractive optical element having a variable curvature, wherein said diffractive optical element has a relief type diffraction grating, of which a grating pitch decreases from a center toward an edge thereof;

measuring means for measuring a shape of said diffractive optical element; and varying means for varying the shape of said diffractive optical element on the basis of the measurement by said measuring means.

25. An exposure apparatus, comprising:

illuminating means for illuminating a mask having a pattern formed thereon; and projecting means for projecting the pattern of the mask onto a wafer, said projecting means including an optical apparatus as recited in any one of claims 19 to 24.

26. A device manufacturing method, comprising the steps of:

providing an exposure apparatus as recited in claim 25;

illuminating, by the illuminating means, a mask having a device pattern formed thereon;

projecting, by the projecting means, the pattern of the mask onto a wafer, to print an image of the device pattern of the mask onto the wafer; and developing the wafer.

27. An exposure apparatus, comprising:

illuminating means for illuminating a mask having a pattern formed thereon;

projecting means for projecting the pattern of the mask onto a wafer; and measuring means for measuring an optical characteristic of said projecting means, wherein said projecting means includes (i) a diffractive optical element having a variable curvature, wherein said diffractive optical element has a relief type diffraction grating, of which a grating pitch decreases from a center toward an edge thereof and (ii) varying means for varying a shape of said diffractive optical element on the basis of the measurement by said measuring means.

* * * * *

UNITED STATES PATENT AND TRADEMARK OFFICE
CERTIFICATE OF CORRECTION

PATENT NO. : 6,295,118 B1
DATED : September 25, 2001
INVENTOR(S) : Seiji Takeuchi It is certified that error appears in the above-identified patent and that said Letters Patent is hereby corrected as shown below:

<u>Drawings,</u>
Sheet 10, FIG. 14, in step 19, "RESIST." should read -- RESIST --.

<u>Column 2,</u>
Line 7, "and" should be deleted.
Line 9, "element," should read -- element; --.
Line 16, "above," should read -- above; --.
Lines 57 and 59, "flow chart" should read -- flowchart --.

<u>Column 3,</u>
Line 11, "member 92$i$" should read -- member 92$_i$ --.
Line 28, "member 93$i$" should read -- member 93$_i$ --.
Line 29, "-the" should read -- the --.

<u>Column 4,</u>
Line 20, "of" should be deleted.
Line 65, "The" should read -- the --.

<u>Column 5,</u>
Line 59, "space 57" should read -- space 66 --.
Line 63, "light 56-reflected" should read -- light 65 reflected --.

<u>Column 6,</u>
Line 64, "arid" should read -- and --.

<u>Column 7,</u>
Line 9, "space 79" should read -- space 78 --.
Line 32, "stage 2" should read -- stage 7 --.

<u>Column 8,</u>
Line 24, "84 and 86" should read -- 74 and 76 --.
Line 26, "lenses 84" should read -- lenses 74 --.
Line 27, "and 86" should read -- and 76 --.
Line 33, "aid" should read -- and --.

<u>Column 10,</u>
Line 9, "flow chart" should read -- flowchart --.
Line 29, "flow chart" should read -- flowchart --.
Line 35, "deposition" should read -- deposition. --.

UNITED STATES PATENT AND TRADEMARK OFFICE
CERTIFICATE OF CORRECTION

PATENT NO.  : 6,295,118 B1
DATED       : September 25, 2001
INVENTOR(S) : Seiji Takeuchi It is certified that error appears in the above-identified patent and that said Letters Patent is hereby corrected as shown below:

<u>Column 11,</u>
Line 5, "safer" should read -- wafer --.

Signed and Sealed this

Thirtieth Day of April, 2002

*Attest:*

JAMES E. ROGAN
*Attesting Officer*   *Director of the United States Patent and Trademark Office*